(12) United States Patent
Ranta

(10) Patent No.: US 7,082,374 B2
(45) Date of Patent: Jul. 25, 2006

(54) ENERGY CONSUMPTION IN ELECTRICAL DRIVE

(75) Inventor: Kari Ranta, Espoo (FI)

(73) Assignee: Abb Oy, Helsinki (FI)

( * ) Notice: Subject to any disclaimer, the term of this patent is extended or adjusted under 35 U.S.C. 154(b) by 0 days.

(21) Appl. No.: 11/022,298

(22) Filed: Dec. 22, 2004

(65) Prior Publication Data

US 2005/0209798 A1    Sep. 22, 2005

(30) Foreign Application Priority Data

Dec. 22, 2003    (FI) .................... 20031885

(51) Int. Cl.
*G01R 21/00* (2006.01)
(52) U.S. Cl. .............................. 702/60
(58) Field of Classification Search .............. 702/57, 702/60, 61, 182; 700/288, 287, 291
See application file for complete search history.

(56) References Cited

U.S. PATENT DOCUMENTS

| | | | |
|---|---|---|---|
| 3,998,093 A | | 12/1976 | Bertolasi |
| 6,775,595 B1 | * | 8/2004 | Yabutani et al. ............ 700/291 |
| 2003/0050738 A1 | | 3/2003 | Masticola et al. |
| 2003/0057904 A1 | | 3/2003 | Sacher |
| 2005/0010334 A1 | * | 1/2005 | Yabutani et al. ............ 700/291 |
| 2005/0159849 A9 | * | 7/2005 | Johnson et al. ............ 700/291 |
| 2005/0192712 A1 | * | 9/2005 | Yabutani et al. ............ 700/291 |

FOREIGN PATENT DOCUMENTS

| | | | |
|---|---|---|---|
| EP | 1 548 925 | * | 6/2005 |
| JP | 2003-228621 | * | 8/2003 |
| WO | WO 86/05887 | | 10/1986 |

OTHER PUBLICATIONS

English Translation of JP 2003-228621, Aug. 2003.*

* cited by examiner

*Primary Examiner*—Michael Nghiem
(74) *Attorney, Agent, or Firm*—Patterson, Thuente, Skaar & Christensen, P.A.

(57) ABSTRACT

The invention relates to a measurement and evaluation method of energy consumption in an electrical drive having a control unit and an AC motor and an arrangement for realizing the method. The method has the following steps. Data of the state of the AC motor, such as power and frequency, is read at measurement points and saved. The energy consumption of the electrical drive is calculated in predetermined measurement intervals. The energy consumption of the virtual AC motor fed by constant-frequency input current is calculated and the energy consumption of an alternative control arrangement is defined in said measurement interval and they are added together. The energy consumption of the electrical drive is compared with the added total energy consumption of the virtual AC motor and the alternative control arrangement in order to evaluate the energy savings achieved by the electrical drive in the measurement time period in question.

11 Claims, 4 Drawing Sheets

ENERGY CONSUMPTION IN ELECTRICAL DRIVE

BACKGROUND OF THE INVENTION (1) Field of the Invention

The invention relates to a method for measuring and evaluating energy consumption in electrical drive, said electrical drive including a control unit and an alternating current (AC) motor, in which method data of the state of the AC motor, such as power and frequency, is read and saved.

The invention also relates to an arrangement for realizing the method. In the arrangement for measuring and evaluating electrical drive energy consumption, said electrical drive includes a frequency converter and an AC motor, and said control unit includes a measurement unit for measuring the state data of the AC motor, such a power and frequency.

(2) Description of Related Art

At present, machines, devices and processes in general, particularly in the industrial sector, are used by electrical drives, where an essential element is an electric motor. Electrical drive is composed of a suitable electricity supply circuit, an electric motor and a control unit suited for controlling and/or regulating said motor. The machine or the like functions as the load in the electrical drive. The most common electric motor used in industrial processes is an alternating current motor, AC motor, particularly an induction motor.

Often the control unit employed in an AC motor is a frequency converter owing to the advantages achieved thereby. As an alternative, the electric motor can be realized as a direct current motor, DC motor, that is regulated by a suitable control unit. Another alternative is that the electric motor is not particularly regulated, but a separate regulation arrangement is made between the electric motor and the machine, or the regulation is realized as a procedure separate from the electrical drive in connection with the actual process.

Electrical drive is designed according to the process, machine or device that should be used by the electrical drive. The electric motor can be considered as a source of moment. The motor must be able to generate a certain moment, it must resist an overload of the process, but the motor must not be thermally overloaded.

Most advantageously an electrical drive provided with a frequency converter is operated by alternating current, AC. This kind of electrical drive comprises an electricity supply circuit, a frequency converter and an AC motor, advantageously an induction motor. A frequency converter includes a rectifier, a direct voltage intermediate circuit and an inverter. Through electricity supply, electric energy is obtained from an electric mains or a corresponding source of electricity, and the electric motor is run by means of said electric energy in order to drive an actuator, such as a machine or a device, connected to its axis. By means of the frequency converter, the electric motor is regulated, for instance as regards its speed of rotation and/or momentum, for driving the working machine and often also the process connected to said actuator.

The load in the electrical drive can be a machine running the process. Among these kind of machines, there are for example various pumps for transfer processes of liquids or the like, fans for air conditioning applications, various working machines, such as conveyors, feeders and machine tools, whereby the material belonging in the process is treated by transporting or by mechanically converting. At present, a common feature for nearly all processes is that they must be regulated and controlled.

There are many simple control methods and arrangements, such as throttling, bypass control and on-off control. The constructing of such arrangements is usually easy, and the investment in the control equipment may often look cost effective. However, simple control arrangements have remarkable drawbacks. An optimal process capacity, which ensures the best quality of the process, is extremely difficult to achieve with simple control arrangements. Moreover, it is pointed out that an increase in the production capacity generally requires reconstruction of the whole production process. Apart from this, with each direct on-line start-up, there is a risk of electrical and/or mechanical damage. An extremely remarkable drawback with simple control arrangements is that they consume a lot of energy, and energy is particularly consumed in various losses.

Electrical drives provided with a frequency converter are becoming more and more common in controlling industrial processes. Particularly such machines and devices where the speed control (speed of rotation) is an essential factor, have obtained electrical drive provided with a frequency converter. The employed frequency converter drives an AC motor, generally a squirrel cage motor, which means that mechanical control systems are no longer necessary. The speed of an electric motor is regulated by a frequency converter that converts the frequency of the voltage fed into the motor. The frequency converter itself is controlled with suitable electric control signals. Moreover, it is pointed out that through the frequency converter, an optimal quantity of electric power is fed in the electric motor and the process, and energy losses are thus avoided.

Four of the most common variable speed drives in the industrial sector are: mechanical variable speed control, hydraulic coupling, DC drive and frequency converter (AC drive). Mechanical variable speed control usually uses belt drives, and the controlling takes place by moving conical pulleys manually or with positioning motors. Hydraulic coupling applies the turbine principle, where the volume of oil in the coupling is changed, so that the speed difference between the driving and driven shafts changes. The oil amount is controlled with pumps and valves. In the DC drive, a DC converter changes the motor supply voltage fed to the DC motor in order to change the rotating speed. In the motor, a mechanical inverter, a commutator, changes direct current to alternating current. In the frequency converter, a standard squirrel cage motor is used. The speed of the motor is regulated by a frequency converter that changes the frequency of the voltage fed into the motor, as was already maintained above.

In mechanical and hydraulic variable speed drives, the control device is located between the electric motor and the working machine. This means that energy losses are created in the control device. Also the maintenance of the device is often difficult. In electrical drive provided with a frequency converter, i.e. electrical variable speed drive, VSD, all control systems are situated in an electric equipment room, and only the driving motor is in the process area. In many processes the production volumes change. Changing production volumes by mechanical means is usually very inefficient. With electrical drive provided with a frequency converter (i.e. electrical VSD), production volumes can be changed by changing the motor speed. This saves a lot of energy, particularly in pump and fan applications, because the shaft power of the motor is proportional to the flow rate to the power of three. Electrical VSD also has other advantages in comparison with electrical drives using conventional control methods and devices. We can use pumping as an example. In traditional methods, there is always a mechanical part and an electric part. In the electric part of throttling, there are needed fuses, contactors and reactors, and valves on the mechanical side. On-off control needs the same electrical components as throttling, as well as pressure tanks on the mechanical side. Mechanical parts are not needed in electrical drive provided with a frequency converter, because all control procedures are realized on the electrical side.

Many surveys and experiments have proved that with electrical VSD, there are easily achieved 50% energy savings in comparison with other conventional electrical drives and regulation systems. This means for example that if the power requirements of a constant speed motor and throttling control system would be 0.7 kW, with electrical VSD they would be 0.37 kW. If a pump would be used 4,000 hours per year, throttling control would need 3,000 kWh, and frequency converter drive would need 1,500 kWh energy per year. In order to calculate the savings, the energy consumption must be multiplied by the price of energy, which fluctuates depending on the availability and supplier of electric energy.

When comparing the advantages on one hand of a conventional constant speed electrical drive provided with a possible control arrangement connected therein, and on the other hand of electrical drive provided with a frequency converter, maintenance and upkeep expenses must also be taken into account. It has been estimated that in the maintenance of throttling control, there is consumed even ten times as much money as in the maintenance of a frequency converter drive. In many cases, a frequency converter needs hardly any maintenance at all, whereas the mechanical devices of conventional control systems require continuous maintenance.

Electrical drives provided with a frequency converter bring savings in energy in most applications, for example in industrial processes, which as such is a known an empirically proved fact. The problem is how to measure and/or evaluate energy consumption and particularly the achieved energy savings in comparison with other known electrical drives and control systems, particularly with electric motor drives operated at a constant speed and with process regulations connected thereto.

For a man skilled in the art, a known solution is to provide an existing, traditional electric motor and electrical drive with suitable measurement sensors, to measure power consumption at suitable intervals, and define energy consumptions on the basis of this. In that case there is measured the power and voltage fed in the electrical drive, and the power and energy consumption are defined according to this principle. On the other hand, as regards an electrical drive provided with a control unit, such as a frequency converter, it is possible to extract the data of the electric motor state, and the power and energy consumption can be defined on the basis thereof. A drawback of the measurement sensor arrangement is that the targets of measurement, i.e. particularly electric motors, must be provided with sensors. A drawback both in the measurement sensor arrangement and in the processing of measurement data extracted directly from the control unit is that both the sensors and the frequency converters must be connected by measurement wires to the measurement device always when measurements are carried out. Another drawback is that in this way, there is not obtained any direct comparison data for the energy consumption of various electrical drives, particularly for electric motors and working machines and the like, provided with various control arrangements. In practice, in one and the same target, the energy consumption of the electrical drive connected in the process is measured prior to replacing the drive (or when planning a replacement), and the energy consumption of a new electrical drive provided with a frequency converter is measured after replacing, i.e. after installing the electrical drive (or there are made preliminary calculations of its energy consumption), and the results are compared for proving that energy has been saved (or for estimating possible savings).

The following publications generally describe the state of the art: U.S. Pat. No. 3,998,093, US 2003/0057904A1 and WO 86/05887.

The patent publication U.S. Pat. No. 3,998,093 introduces a system for monitoring and controlling the consumption of energy, where the actual consumed energy is compared with an ideal or desired energy consumption, and both are displayed. The system is particularly used for monitoring the consumption of electric energy or gas in an industrial plant. The comparison between actual and ideal energy consumption is displayed for the working staff as visual information on a suitable display. When necessary, an alarm can be given, in case a predetermined threshold value between the actual and ideal energy consumption is surpassed. The object of this system is mainly to save energy, and particularly to monitor the ratio between the actual and the ideal energy consumption in an easily readable way.

The patent application US 2003/0057904A1 discloses a control system utilizing feedback, which system is applied in an electric motor running a rotary machine, such as a pump or a fan. This control system makes use of a predetermined specific curve of for example the capacity of a rotary pump and the motor intake power for realizing feedback control. This procedure replaces the earlier used pressure sensors or pressure difference sensors in the control system. The object of the invention is to optimize energy consumption and to reduce noise.

The international patent application WO 86/05887 discloses a power meter which is able to display the power consumed and the cost of power consumed. The device provides a continuous measurement of the electrical power consumed, which gives a more accurate measurement than measurement at discrete intervals of time.

SUMMARY OF THE INVENTION

The object of the present invention is to eliminate the drawbacks connected to the measurement and/or evaluation of the above described energy consumption. Another object of the invention is to realize a new method and arrangement for evaluating consumption and particularly savings of electric energy between conventional electrical drive and an electrical drive provided with a control unit in general and a frequency converter in particular.

The method according to the invention for measuring and evaluating energy consumption in an electrical drive is applied to the electrical drive, which comprises a control unit and an AC motor. In the method, the data of the control unit related to the state of the AC motor, such as the power and frequency, are read and saved. Further in the method:

the data from the control unit related to the state of the AC motor is utilized so that at least in one predetermined measurement time period, at predetermined measurement intervals at the measurement points, the state data is read, and the measurement values of power and frequency are saved in the measurement register, the energy consumption of the electrical drive is calculated at least in one predetermined measurement time period, the power value of a virtual AC motor that is fed by constant-frequency input current is defined on the basis of the power and frequency values saved in the measurement register, the energy consumption of the virtual electric motor fed by constant-frequency input current are calculated in said measurement time period, the energy consumption of an alternative control arrangement is defined in said measurement time period, the calculated energy consumptions of the virtual AC motor and the alternative control arrangement are added together, and the energy consumption of the electrical drive is compared with the added total energy consumption of the virtual electric motor and the alternative control arrangement in order to evaluate the energy savings achieved by the electrical drive in the measurement time period in question.

The measurement and evaluation arrangement of an electrical drive according to the invention, where said electrical drive comprises a control unit and an AC motor, said control unit includes a measurement unit for measuring the state data of the AC motor, such as power and frequency. The arrangement includes:

a definition unit, where one or several measurement time periods are defined, as well as the measurement points at predetermined measurement intervals, i.e., sample intervals, for reading the measurement values of power and frequency of the AC motor in the control unit, a measurement unit arranged to read at least in one predetermined measurement time period, at predetermined sample intervals at the measurement points, state data of the AC motor, and particularly the measurement values of power and frequency, a memory unit, where the power and frequency values written therein are saved together with their measurement point data, and converted into a measurement register, and a calculation unit including:
  means for calculating the energy consumption of the electrical drive in said measurement time period,
  means for defining the power value of a virtual AC motor that is fed by constant-frequency input current, and for calculating the energy consumption of the virtual AC motor in said measurement time period,
  means for calculating the energy consumption of at least one alternative control arrangement in said measurement time period,
  means for adding together the calculated energy consumption of the virtual AC motor and to calculated energy consumption of the alternative control arrangement in said measurement time period,
  means for comparing the calculated energy consumption of the electrical drive and the added total energy consumption of the virtual electric motor and the alternative control arrangement for evaluating the energy savings achieved by the electrical drive in said measurement time period.

In a method according to the invention, also the energy consumption of an alternative control system with respect to the control unit, such as a frequency converter, is taken into account. Thus the power losses of one or several alternative control systems are modeled, and on the basis of said modeling, the energy consumption of the control system is defined in the measurement period, and the energy consumption of the control system is added to the energy consumption of an electric motor fed by constant-frequency input power in one or several predetermined periods of time. Among these alternative control systems are for example throttling, on-off control and slip control.

In a preferred embodiment of the invention, the number of measurement points in a measurement period is defined on the basis of the accepted maximum error of the power value. The purpose of this is that the numerical integration of energy consumption is made sufficiently accurate at the same time as the number of the measurement points is optimized. Energy consumption can be calculated by various numeric methods that also include an error estimation procedure or formula for estimating the maximum error. For instance in a preferred embodiment of the invention, energy consumption can be calculated on the basis of the measurement data collected from the measurement register by using a trapezoid formula, in which case the optimal number of the measurement points can be defined, on certain conditions, on the basis of the error clause of the trapezoid formula.

In another preferred embodiment of the invention, the measurement register is converted to a graphical power-frequency pattern, advantageously a curve, by means of which the power value of a virtual electric motor fed by constant-frequency input current is defined. In that case the virtual electric motor is an AC motor that is run at constant speed. The power value of the virtual electric motor is defined by this method in a case where the frequency control range of a control unit, such as a frequency converter, does not during the measurement period reach said constant frequency, which is usually the frequency of the electric mains. In case the frequency control range of the frequency converter reaches said constant frequency, the power value of the virtual electric motor is obtained directly from the measurement data and the measurement register.

In a preferred embodiment of the invention, the above presented graphical power-frequency pattern is advantageously defined mathematically as a polynom of a third degree, so that the coefficients are matched with the measured power-frequency value pairs. In this matching operation, there can for example be used the least squares method, in order to make the measurement values and the curve as compatible as possible.

An important advantage achieved by the invention is that the method and arrangement according to it provides a possibility to measure and/or evaluate energy consumption and particularly the achieved energy control in an electrical drive provided with one electrical drive, particularly in an electrical drive provided with a frequency converter, in comparison with other known electrical drives and/or control systems. The invention is based on the operation-time measurement of one real electrical drive, in connection with which drive there is constructed a reference electrical drive, and the energy consumption of said reference drive is defined on the basis of the same operational time data. Thus the energy consumption of two (or even several) electrical drives used in the same conditions can be mutually compared. Earlier it has been extremely difficult to carry out similar energy consumption comparisons, and therefore they have generally been left undone. A corresponding measurement and evaluation arrangement has not been described in any of the above mentioned reference publications representing the general state of the art.

Another advantage of the invention is that by means of it, the benefits of an electrical drive that is particularly based on a frequency converter and of applied speed regulation are found out in a simple and effective way in comparison with other control systems. A particular advantage of the invention is that thereby different electrical drives can be compared, and the best possible electrical drive solution can be found from the point of view of both the application target and energy consumption. Consequently, for example premade energy savings calculations can be checked and verified, and the cost-efficiency of corresponding new electrical drives, particularly electrical drives provided with a control unit, particularly a frequency converter, can be estimated.

BRIEF DESCRIPTION OF THE DRAWINGS

The invention and its further advantages are described in more detail below, with reference to the appended drawing, where.

Like reference numbers for like parts are used in the drawings.

DETAILED DESCRIPTION OF THE INVENTION

Figure 1:
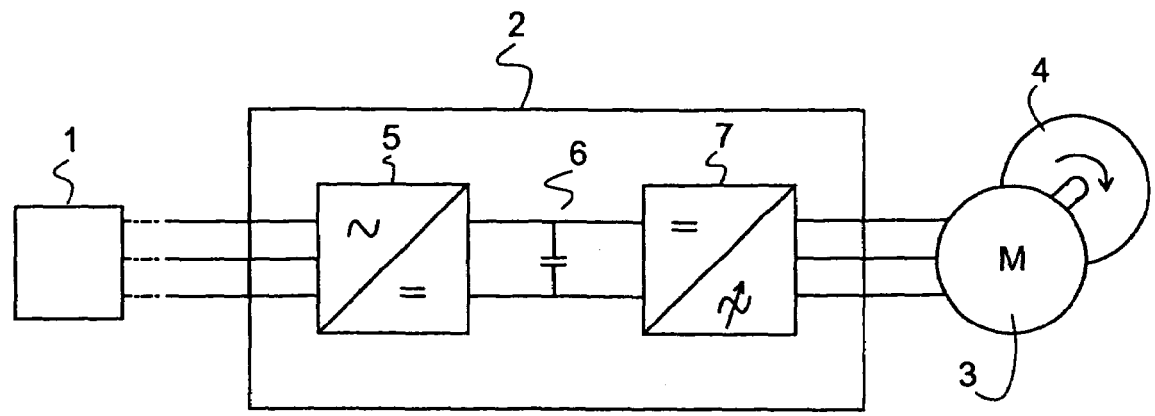
FIG. 1 is an illustration in principle of a an electrical drive provided with a frequency converter.

An electrical drive, one example of which is illustrated in FIG. 1, comprises an electricity supply 1, a control unit that is advantageously realized as a frequency converter 2, an AC motor 3, in this case a three-phase motor. The electrical drive is operated for running, for example rotating, a load 4 that can be for instance a pump. The electricity supply 1 comprises an alternating current mains, such as a three-phase mains, or a corresponding alternating current source for feeding electric energy into the electrical drive. The AC motor 3 is advantageously a squirrel cage motor, which is the most common electric motor used in industrial processes.

Figure 2:
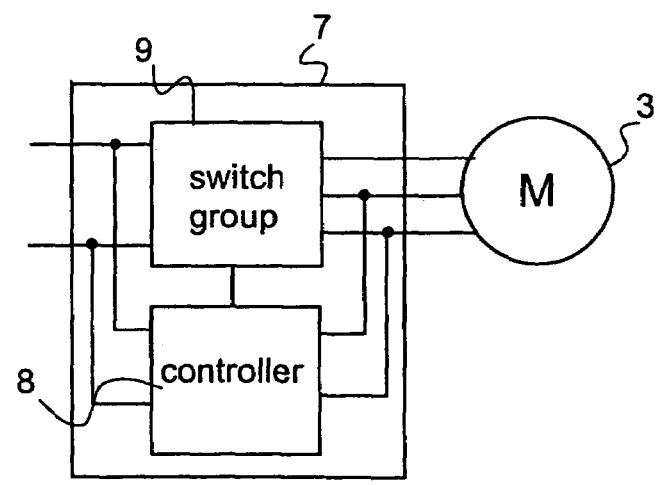
FIG. 2 is a schematical illustration of the frequency converter of FIG. 1.

In this embodiment the control unit, in this case a frequency converter 2, comprises a rectifier 5, a direct voltage intermediate circuit 6 and an inverter 7. The inverter 7 of the frequency converter 2 is illustrated as a block diagram in FIG. 2. The inverter 7 comprises a switch group 9 and a controller 8. By means of the controller 8, the six switches of the switch group are controlled, so that a current and voltage with a changing frequency and with a suitable magnitude can be fed in the motor 3.

In an electrical drive provided with a frequency converter, there are normally measured the state data of the electric motor, particularly the input current and input voltage I, U of the different phases, as well as the frequency f, for regulating the speed of the electric motor. The regulation is carried out in the controller 8, which receives control instructions as a suitable electric signal from outside the electrical drive, for instance from the process measurement data, as a suitable speed instruction. By means of said currents and voltages I, U, the power of the electric motor can be calculated for example in the controller 8, (or outside said controller, but preferably, however, in the control unit) at each point of time, and this can be utilized in the frequency converter for regulating the motor.

Figure 3:
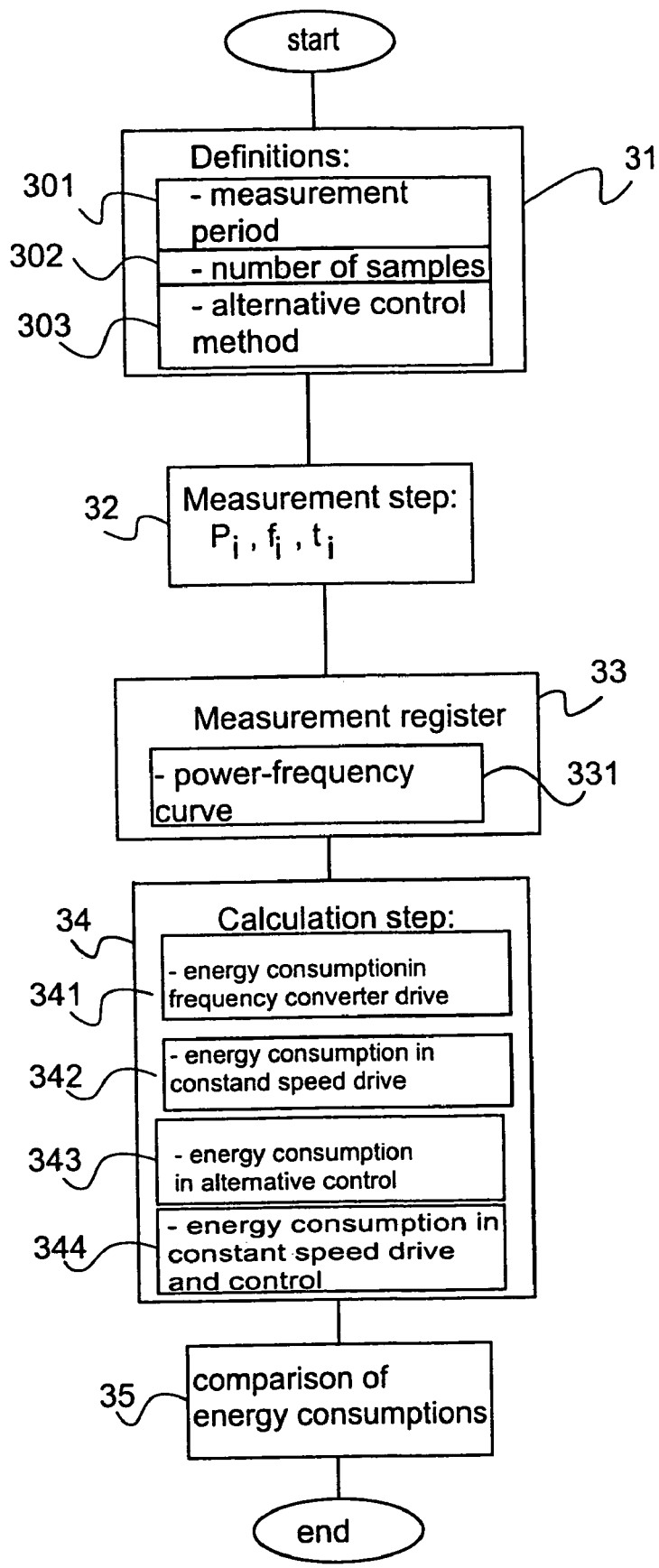
FIG. 3 is a flowchart of a method according to the invention.

A method according to the invention, the flow diagram in principle of which is illustrated in FIG. 3, relates to a measurement and evaluation method of energy consumption, which method is applied in an electrical drive provided with a control unit, particularly a frequency converter, and an AC motor, such as in the electrical drive illustrated in FIG. 1.

In the first step 31, prior to the actual measurements, certain definitions are carried out. The first definition period 301 relates to the measurement time period T and the number of samples n. The measurement time period T is chosen individually in each case. If the night-time and daytime energies have different grounds for invoicing, it is natural to choose at least 24 hours as the measurement time period. Then again, if a week describes the rhythm of operations with a load provided with electrical drive, such as a device or a plant, the selected measurement time period is a week. In case the power of the electrical drive is known to fluctuate owing to an external factor, such as the season, the measurement can be arranged to be repeated during different seasons, for example in the cold and warm season, in order to make the measurement time periods together describe the total time of the energy calculation. In order to make reporting easier, the length of the measurement time period is advantageously chosen in advance, so that it is of the order of whole hours or whole days.

It is also advantageous to choose the number of the measurement points $t_i$, i.e. the number of samples n before the measurement operation. The measurement points $t_i$ follow each other in timewise succession i=1, 2, 3, . . . n at certain measurement intervals, i.e. sample intervals Δt, which interval depends on the number of samples n. The longer the measurement time period T is, the larger the number of the measurement points n is. For practical reasons, it is in that case sensible to choose the calculation method and the sample interval so that the numeric integration applied in the calculation of energy consumption over the measurement points becomes sufficiently accurate, but the number of measurement points is not unnecessarily increased. There are several alternative methods, and for each of them there exist clauses for estimating the maximum error, as far as there is obtained information of the derivatives of the power signal. For example the error of a trapezoid formula is in the form $$\varepsilon = \frac{(T_b - T_a)^3}{12n^2} P''(t) \qquad (1)$$

where $T_b$ the terminal moment of integration, i.e. the terminal point of the measurement time period $T_a$ the starting point of the integration, i.e. the initial point of the measurement time period n number of samples P''(t) second derivative of power (and first derivative of power change speed)

ε accepted error

The accepted error ε is defined and set. Then in the equation (1) there is solved a necessary quantity of samples n, which are added to the definitions.

The first definition period 301 described above is useful for achieving a good and reliable energy consumption estimate. It also is advantageous to define in the second definition period 302 the model of the graphical power-frequency pattern, advantageously a curve model describing the mutual co-dependence of these two, which curve model is advantageously applied later, on certain conditions, when processing the measurement register of the method.

In a general case, the shape of the power-frequency pattern or curve PF is in the form $$PF = a \cdot f^3 + b \cdot f^2 + c \cdot f + d \quad (2)$$

where a, b, c and d are constants and f=frequency.

The form of the power-frequency curve PF is a polynom of a third degree, and the constants are its coefficients. This is based on the fact that at least part of the electric motor power is consumed in the countermoment $a \cdot f^3$ of the rotation speed, i.e. a countermoment proportional to a quadrature of the frequency. This may in some cases represent only a small part of the whole power, but for example in an electric motor running a centrifugal pump, it represents the major part of the whole power. The constant countermoment results in a third term $b \cdot f^2$, which as such is fairly common. Another term $c \cdot f$ is seen for instance in working machines, and it is needed for the sake of perfection. The last term d reflects power independent of the frequency, which as such is also present, at least in the form of losses.

It also is advantageous to define, in the third definition period 303, the power losses of an alternative control arrangement with respect to an electrical drive applying a frequency converter, and particularly its modeling in order to evaluate energy consumption. This shall be dealt with below.

When the definitions sufficient for the measurements are carried out in step 31, the measurement step 32 is advantageously started, for example as controlled by the system clock, or by intermediation of a timer. In the measurement step 32, in a predetermined one or several measurement time periods T, at predetermined measurement intervals, i.e. sample intervals Δt, at measurement points $t_i$, the state data of the electric motor, particularly the measurement values $P_i$, $f_i$ of power and frequency are read from the control unit of the frequency converter and saved in the next step, i.e. the saving step 33, in the measurement register. In case the power measurement value cannot be directly read, the required voltage and power values of one or several steps are read in order to calculate the power. For example the input power $P_i$ of a three-phase motor at the measurement point $t_i$ is obtained from the known formula $$P_i = \sqrt{3} U_i I_i \cos(\Phi), \quad (3)$$

where $U_i$=phase voltage, $I_i$=phase current and φ=power coefficient. Each measuring event at each measurement point is given a time stamp, reflected by the symbol $t_i$ of the measurement point.

When the measurement step 32 and the measurement data saving step 33 are carried out in the measurement time period, in a preferred embodiment of the invention the measurement values $P_i$, $f_i$ are matched in the model of the power-frequency pattern, cf. formula (2), or in a corresponding predetermined pattern model, and the constants a, b, c and d are solved. This is carried out in the modeling step 331 of the power-frequency pattern. Thereafter the measured power as the function of frequency can be represented for example as a graphical curve on the display, and it can be used for defining the power consumption of an AC motor operated at constant speed, as shall be described below.

In the first calculation period 341 of the calculation step 34, the energy consumption of the electrical drive provided with a frequency converter is calculated on the basis of the measurement results $P_i$, $f_i$ during said measurement period T. When the measurement and registering of power (or of corresponding voltage and current values) is carried out by means of a frequency converter, and not for example with a power meter connected in front of the frequency converter, in addition to the power time distribution, there is obtained information of the integral of the operation speed, which often describes the volume of a working machine output. In nearly all cases, the output is proportional to speed, i.e. to the rotary speed of the drive shaft, which means that in an electrical drive applying a frequency converter, it is proportional to frequency. This kind of applications are used for instance in paper machines, conveyors, pumps and various vehicles. The profile and quantity of the output becomes important in comparison with on-off type controls.

The energy consumption E of an electrical drive provided with a frequency converter, where particularly rotary speed regulation is applied, is obtained for example by a trapezoid formula as follows:

$$E_{day} = \sum_{i=day} (P_i + P_{i+1})/2 \cdot (t_{i+1} - t_i) \quad (4)$$

$$E_{night} = \sum_{i=night} (P_i + P_{i+1})/2 \cdot (t_{i+1} - t_i), \text{ where} \quad (5)$$

$P_i$ = measurement point, such as measured power $t_i$ = measurement points of a daytime/night-time measurement time period T Daytime energy consumption $E_{day}$ is obtained from the formula (4), and night-time energy consumption $E_{night}$ is obtained from the formula (5). The point of time and length of the measurement time period T in the formulas (4) and (5) are defined so that i=daytime falls at a predetermined time period in the daytime (for example between 6.00 am and 6.00 pm) and respectively i=night falls at a predetermined time period in the night-time (for example between 6.00 pm and 6.00 am).

Preferably the sum of the daytime and night-time measurement time periods is 24 hours. By a corresponding basic formula, there is generally defined the energy consumption of the measurement time period T.

The output volume $O_{meas}$ during the measurement time period is obtained as follows:

$$O_{meas} = \sum_i (f_i + f_{i+1})/2 \cdot (t_{i+1} - t_i), \text{ where} \quad (6)$$

$f_i$ = frequency measured at the measurement point $t_i$

In the second calculation period 342 of the calculation step 34, the energy consumption of a virtual electric motor, particularly an AC motor, fed by constant-frequency input current and consequently operating at a constant speed, is calculated on the basis of the measurement time period data. In basic drive (without frequency converter), alternating current is fed in the electric machine at a constant frequency, i.e. generally at the mains frequency, from a suitable source of electricity. The energy consumption of the basic drive of this type of electric machine is obtained from the processed measurement data, either directly from the data power vs. frequency, or by interpolating the power-frequency curve to constant frequency, at which the constant-speed motor is operated, and by reading the power value therefrom.

Figure 4:
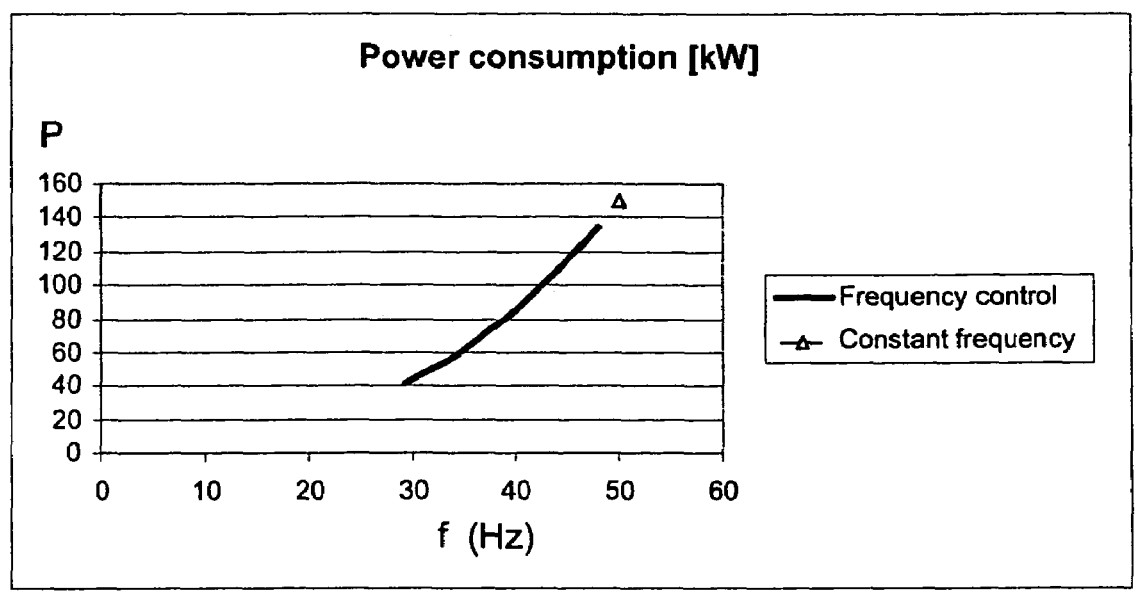
FIG. 4 is a schematical illustration of a power-frequency pattern, particularly curve, constructed on the base of the measurements.

In FIG. 4 the power-frequency curve is formed by utilizing the curve model according to formula (2), and thus it represents measurement, and the point illustrated in the drawing represents the motor rotated at a constant speed (and constant frequency).

In the third calculation period 343 of the calculation step 34, there is calculated other possible energy consumption that is connected to an electric motor fed by constant-frequency input current and operated at a constant speed, and particularly to the control systems arranged in connection with it.

Frequency converter drive is applied for regulating alternating current electric motors, particularly for regulating its rotation speed, and for controlling it in many different targets both in industry and in the constructed environment in general.

Instead of a frequency converter drive, there were earlier used, and are still widely used electric motor drives operated at a constant speed, and for controlling these, other generally known control methods are applied. Among the most common of these are throttling, on-off control and slip control. In case this type feed control method is applied, it causes additional losses in the process. This kind of alternative control method is generally known in the field, and the energy consumption caused by it can be defined by calculatory means.

In the third definition period 303 of the definition step 31, the power losses/energy losses of a control arrangement alternative to an electrical drive applying a frequency converter are converted into models that are then applied in the third calculation period 343 of the calculation step 34, for calculating the power losses/energy losses of the alternative control arrangement.

In the third definition step 303, there is defined an alternative control arrangement and defined a calculatory model for calculating the energy losses thereof, i.e. the power and/or energy losses of the alternative control arrangement are modeled, as was maintained above. Next we shall observe particularly throttling, on-off control and slip control, which are widely used control methods.

The energy consumption of throttling control is obtained from the formula $$E_{t,day}=P_{max}*\Delta T_{day} \quad (7)$$

where $P_{max}$=the power required by throttling control, i.e. the power of a virtual motor fed by constant frequency $\Delta T_{day}$=the daytime energy time collected in the measurement, i.e. the daytime measurement time period $E_{t,day}$=daytime energy consumption with throttling The consumption of night-time energy with throttling, or in general the energy consumption of a predetermined measurement period with throttling, is obtained in a similar way.

The realization of on/off control is affected by: a) planned maximum output, b) volume of the "storage capacity" in the product and c) for the sake of controllability, the on-time cannot be full 100%. For economical reasons, on-times that fall below 90% are disadvantageous for a maximum output, because then the equipment would be outsized in all situations. As a result, the power demand is higher than with a frequency converter input, and thus the output volume also is larger from time to time, although it in average represents a similar quantity as with frequency converter input.

For example in the case of pumping, storage capacity is represented by the size of the storage tanks. Because the purpose is not to make this control method worse than it is, the starting frequency of the control is requested from the maker of the analysis. However, starting intervals longer than the time limits for night-time rates are not sensible, i.e. it is sensible to start at least once with a night-time rate.

Consequently, calculation proceeds as follows: a) output is calculated per start interval, b) it is calculated how long $\Delta T_{on}$ the constant-speed motor would be on (start interval) and c) finally there is calculated the energy consumption $E_{on/off}$.

The output during the start interval is obtained from the formula:

$$\Delta T_{on}=O_{meas}*\Delta T_{start}/O_{on\text{-}off} \quad (8)$$

where $O_{meas}$=measured output
$O_{on\text{-}off}$=maximum output of on-off control
$\Delta T_{start}$=start interval
$\Delta T_{on}$=on-time of on-off control The energy consumed during the on-step, particularly the daytime energy consumption $E_{on/off, day}$, is obtained from the formula:

$$E_{on\text{-}off,day}=P_{max}*\Delta T_{on} \quad (9)$$

By a corresponding formula, there is defined the night-time energy consumption $E_{on/off, night}$.

Slip control is typically realized by hydraulic couplings or eddy-current break couplings. Generally the control device requires cooling, which here must be ignored. It is assumed that when desired, the slip can be controlled to zero. This is possible in some devices.

In this method, every sample point is recalculated, so that the electric power is converted as follows:

$$P_{slip,i}=P_i/f_i*f_s \quad (10)$$

where $P_i$=sample point power
$f_i$=sample point frequency
$f_s$=mains frequency
$P_{slip,i}$=motor power at slip frequency With slip control, the daytime and night-time energy consumptions $E_{slip, day}$, $E_{slip, night}$, are calculated separately from the powers.

$$E_{slip,day} = \sum_{i=day} (P_{slip,i} + P_{slip,i+1})/2 \cdot (t_{i+1} - t_i) \quad (11)$$

$$E_{slip,night} = \sum_{i=night} (P_{slip,i} + P_{slip,i+1})/2 \cdot (t_{i+1} - t_i) \quad (12)$$

When the alternative control method is known, and the power and/or energy consumption resulting from said control method is appropriately modeled and defined, the energy consumption can now be calculated in the third calculation period 343 of the calculation step 34. Next, in the fourth calculation step 344, the combined energy consumption of an electric motor operated at a constant speed and of an alternative control method connected thereto can be calculated during said measurement period.

In the comparison step 35, the calculated energy consumption (step 341) of the frequency converter drive is compared with the energy consumption of an electric motor drive operated at constant speed and the energy consumption of the alternative control method (steps 342, 343), and the result from the comparison is given for example as a value of absolute energy consumption, or in percentages as energy savings of the electrical drive provided with a frequency converter in comparison with an ordinary electrical drive.

In special cases, it may be desirable to obtain only the electrical drive power as a function of frequency, irrespective of the output distribution. In that case, the frequency converter can be controlled throughout the interesting frequency range, from minimum to maximum frequency. This measurement can be carried out in the course of a few minutes, and thus it differs from the collecting of the actual survey material. As a result, there is obtained the power as a function of the frequency in graphical illustration.

The invention also relates to an arrangement 50 for measuring and evaluating the energy consumption of an electrical drive, which electrical drive includes a control unit, in this case a frequency converter, and an AC motor. By means of this arrangement, the method according to the invention can be realized.

Figure 5:
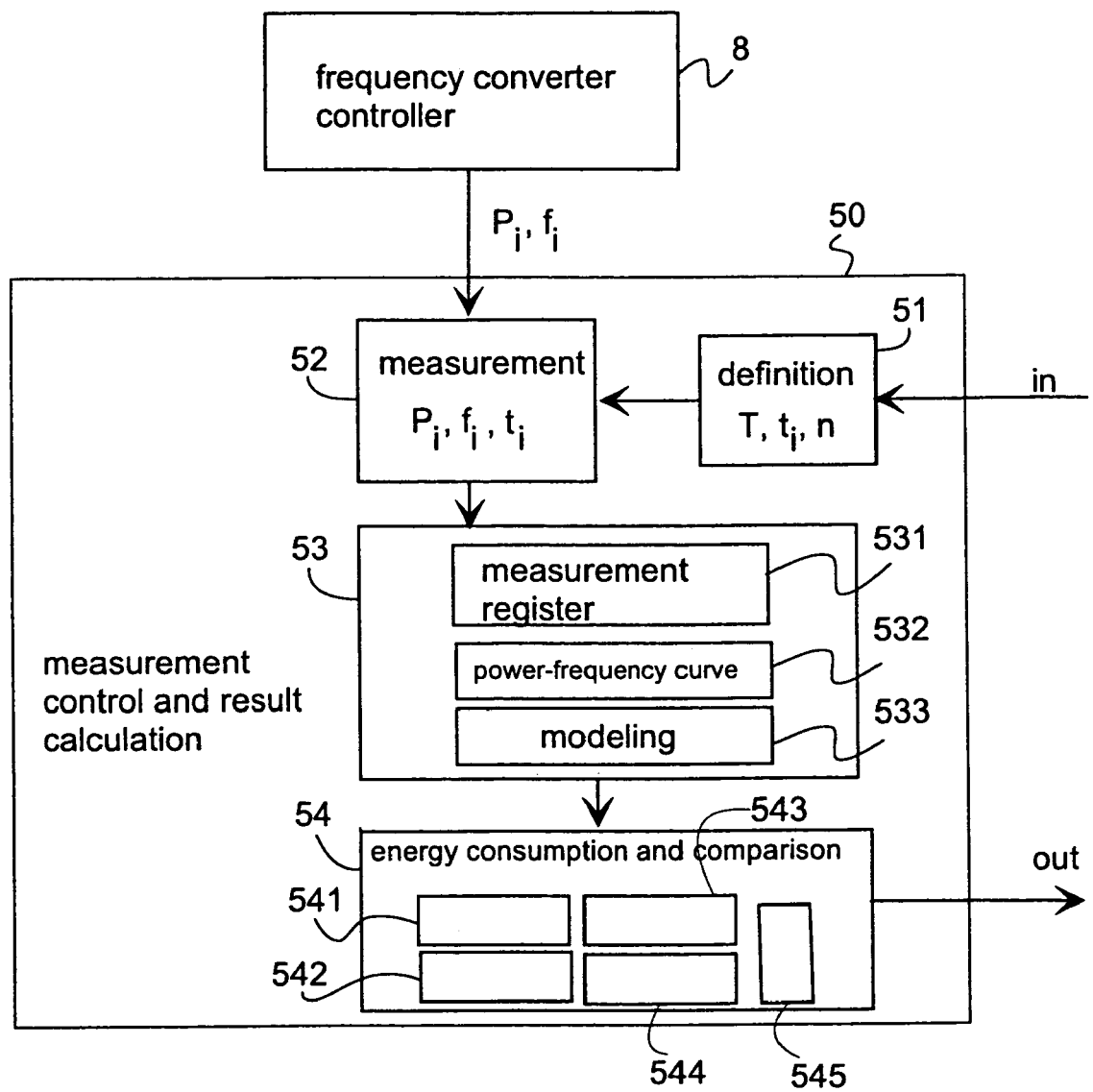
FIG. 5 is a block diagram illustrating an arrangement according to the invention.

The arrangement 50 according to the invention, FIG. 5, includes at least a definition unit 51, a measurement unit 52, a memory unit 53 and a calculation unit 54. One or several measurement time periods T and its measurement points $t_i$ at predetermined measurement intervals, i.e. sample intervals $\Delta t$, are defined in the definition unit 51. At least the start and end moments of the measurement time period T, and the sample number n or sample interval $\Delta t$, are given from outside the arrangement. By means of the measurement unit 52, at the measurement points $t_i$, there are read during said measurement time period the measurement values $P_i$, $f_i$, of the power and frequency of the AC motor. The read measurement values are saved, together with the measurement point data, in the memory unit 53. Of the measurement values A, there is created a measurement register 531.

It can be maintained that in the definition unit 51, there is generally realized the first or definition step 31 according to the method of the invention, at least the first and third definition period 301 and 303, and respectively in the measurement unit 52 there are realized the measurement steps 32, and in the memory unit 53 there is realized the measurement data saving step 33 and other steps that are alternatively connected thereto. In the calculation unit 54, there are respectively realized the calculation steps 34 and the energy consumption comparison step 35.

The calculation unit 54 comprises a first means 541 for defining the power value of a virtual AC motor that is fed by constant-frequency input current, and for calculating the energy consumption thereof in one or several predetermined measurement time periods. The calculation unit 54 also comprises a second means 542 for calculating the energy consumption of an electric motor provided with frequency converter or a corresponding control unit i.e. applied electrical drive in predetermined one or several measurement time periods. The calculation unit 54 further comprises a third means 543 for calculating the energy consumption of one or several alternative control systems in predetermined one or several measurement time periods. The calculation unit 54 advantageously comprises also a fourth means 544, where the energy consumption of said virtual AC motor and the energy consumption of said alternative control arrangement are added together and a fifth means 545 where the calculated energy consumption of the applied electrical drive are compared with the total added energy consumption of the virtual AC motor and the alternative control system for estimating the energy savings brought by the electrical drive in said measurement time period/periods.

The arrangement 50 also advantageously comprises means 532 for forming a graphical power-frequency pattern, advantageously a curve, of the measurement value data. The means 532 can be arranged for example in connection with the memory unit 53 or, as an alternative, in connection with the calculation unit 54.

The arrangement 50 also includes a modeling unit 533 of the a power-frequency pattern, advantageously a curve, where measurement value data is converted into a power-frequency pattern that in mathematical shape is a polynom PF of a third degree, $PF=af^3+bf^2+cf+d$, so that the polynom coefficients a, b, c and d are matched in the measured power-frequency value pairs $P_i$, $f_i$. The modeling unit 533 can be situated for instance in connection with the memory unit 53, or as an alternative, in connection with the calculation unit 54.

In connection with the calculation unit 541, there are advantageously provided means 542 for modeling the energy consumption of the alternative control arrangement, and on the basis of said modeling, the energy consumptions in the control system are defined and calculated in the measurement period.

It can be maintained that in the calculation unit 54, there are generally realized the calculation steps 34 of a method according to the invention, as well as the energy consumption comparison step 35.

The collection and processing of the power and frequency data of an electrical drive provided with a frequency converter is realized by means of an arrangement 50, which is preferably realized as a data processing unit. The data processing unit includes a microprocessor or the like. In addition, the data processing unit of the arrangement is connected to or includes one or several memory units for recording measurement data, intermediate results and end results. The collecting of desired data is realized by means of the data processing unit, in a predetermined way and in a controlled fashion from the control unit of the actual electrical drive, for example from the controller 8 of the frequency converter, as is illustrated in FIG. 5. The processing of the collected data and the calculation of the energy quantities is preferably realized by means of software processing units recorded in connection with the microprocessor, such as a definition unit 51, a measurement unit 52, and calculation unit 54. The results, i.e. the calculated power values and their identifier data are recorded in one or several memory units, such as a memory unit 53 in the data collection step, and the results from the energy consumption comparison can also be recorded in a suitable memory unit.

It is pointed out that one or several electrical drives can be simultaneously analyzed by one energy consumption measurement and evaluation arrangement according to the invention. The measurement and evaluation arrangement can be fitted in the actual electrical drive control unit, such as a frequency converter, as an integrated part thereof, or it can alternatively be realized as an external arrangement of one or several electrical drives. In that case the arrangement is for example integrated in a personal computer and connected to an electrical drive/electrical drives by a suitable data transmission bus.

In the above specification, the invention is described mainly with reference to an electrical drive that includes a frequency converter as the control unit. However, for a man skilled in the art it is obvious to apply the invention also to other types of electrical drive control units, such as cyclo converters. The essential feature in these control units are the measurements of the current, voltage and frequency of the electric motor for controlling and running the motor, and particularly these measurement signals are made use of in the invention.

The invention is not restricted to the described embodiments only, but many modifications are possible within the scope of the inventive idea defined in the appended claims.

The invention claimed is:

1. A measurement and evaluation method of energy consumption in an electrical drive, said electrical drive including a control unit and an AC motor, the method comprising the steps of:

utilizing the data from the control unit related to the state of the AC motor so that at least in one predetermined measurement time period, at predetermined measurement intervals at the measurement points, the state data is read, and the measurement values of power and frequency are saved in the measurement register, calculating the energy consumption of the electrical drive at least in one predetermined measurement time period, defining the power value of a virtual AC motor that is fed by constant-frequency input current on the basis of the power and frequency values saved in the measurement register, calculating the energy consumption of the virtual electric motor fed by constant-frequency input current in said measurement time period, defining the energy consumption of an alternative control arrangement in said measurement time period, adding together the calculated energy consumptions of the virtual AC motor and the alternative control arrangement, and comparing the energy consumption of the electrical drive with the added total energy consumption of the virtual electric motor and the alternative control arrangement in order to evaluate the energy savings achieved by the electrical drive in the measurement time period in question.

2. A method according to claim 1, further comprising the step of defining that the number of the measurement points in the measurement time period is defined on the basis of the accepted maximum error of the energy values.

3. A method according to claim 1, further comprising the step of converting the power and frequency values obtained from the measurement register into a graphical power-frequency pattern, advantageously a curve, by which the power value of a virtual electric motor fed by constant-frequency input current is defined.

4. A method according to claim 3, further comprising the step of converting the power and frequency values of the measurement register into a power-frequency change pattern that in mathematical form is a polynom of a third degree, $PF=af^3+bf^2+cf+d$, so that the coefficients a, b, c and d of the polynom are matched with the measured power-frequency value pairs.

5. A method according to claim 1, further comprising the step of defining the energy consumption of an electric motor provided with a control unit by utilizing the following trapezoid formula:

$E=\Sigma(P_i+P_{i+1})/2(t_{i+1}+t_i)$, where

E=energy consumption
$P_i$=power measured at the measurement point $t_i$
$t_i$=measurement points of the measurement period T.

6. A method according to claim 1, further comprises the step of applying the method in an electrical drive that includes a frequency converter as a control unit.

7. An arrangement for measuring and evaluating electrical drive energy consumption, said electrical drive including a frequency converter and an AC motor, and said control unit including a measurement unit for measuring the state data of the AC motor, such as power and frequency, wherein the arrangement comprises:

a definition unit, where one or several measurement time periods are defined, as well as the measurement points at predetermined measurement intervals, i.e. sample intervals, for reading the measurement values of power and frequency of the AC motor in the control unit, a measurement unit arranged to read, at least in one predetermined measurement time period, at predetermined sample intervals at the measurement points, state data of the AC motor, and particularly the measurement values of power and frequency, a memory unit, where the power and frequency values written therein are saved together with their measurement point data, and converted into a measurement register, and a calculation unit including:
means for calculating the energy consumption of the electrical drive in said measurement time period, means for defining the power value of a virtual AC motor that is fed by constant-frequency input current, and for calculating the energy consumption of the virtual AC motor in said measurement time period, means for calculating the energy consumption of at least one alternative control arrangement in said measurement time period, means for adding together the calculated energy consumption of the virtual AC motor and the calculated energy consumption of the alternative control arrangement in said measurement time period, means for comparing the calculated energy consumption of the electrical drive and the added total energy consumption of the virtual electric motor and the alternative control arrangement for evaluating the energy savings achieved by the electrical drive in said measurement time period.

8. An arrangement according to claim 7, wherein the arrangement further comprises means for forming a graphical power-frequency pattern, advantageously a curve, of the measurement data.

9. An arrangement according to claim 8, that the arrangement further comprises a modeling unit of the power-frequency pattern, where the measurement data may be converted into a power-frequency change pattern, which in mathematical form is a polynom PF of the third degree, $PF=af^3+bf^2+cf+d$, so that the coefficients a, b, c and d of the polynom are matched with the power-frequency value pairs.

10. An arrangement according to claim 8, wherein the arrangement further comprises means for modeling the energy losses of the alternative control arrangement.

11. An arrangement according to claim 7, wherein the electrical drive further comprises a frequency converter as a control unit.

* * * * *